US007211926B2

(12) United States Patent
Quevy et al.

(10) Patent No.: US 7,211,926 B2
(45) Date of Patent: May 1, 2007

(54) TEMPERATURE COMPENSATED OSCILLATOR INCLUDING MEMS RESONATOR FOR FREQUENCY CONTROL

(75) Inventors: Emmanuel P. Quevy, El Cerrito, CA (US); Roger T. Howe, Los Gatos, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 11/361,814

(22) Filed: Feb. 23, 2006

(65) Prior Publication Data

US 2006/0261703 A1 Nov. 23, 2006

Related U.S. Application Data

(60) Provisional application No. 60/660,211, filed on Mar. 9, 2005.

(51) Int. Cl.
*H03B 28/00* (2006.01)
*H03B 5/04* (2006.01)

(52) U.S. Cl. ............ 310/315; 310/309; 331/66; 331/69; 331/108 D; 331/155; 331/156; 331/177 R

(58) Field of Classification Search ............ 331/66, 331/69, 108 D, 155, 156, 177 R; 310/315, 310/318, 319, 309
See application file for complete search history.

(56) References Cited

U.S. PATENT DOCUMENTS 5,883,550 A * 3/1999 Watanabe et al. ........... 331/176

6,239,662 B1 * 5/2001 Fukayama et al. ............ 331/66
6,788,159 B2 * 9/2004 Takahashi et al. ........... 331/176

FOREIGN PATENT DOCUMENTS

WO WO/2002/003540 * 10/2002
WO WO/2004/102808 * 11/2004
WO WO/2005/101664 * 10/2005

OTHER PUBLICATIONS

G.C.M. Meyer, "Thermal Sensors Based on Transistors", Sensors and Actuators, vol. 10, pp. 103-125, 1986.S.
John R. Vig, "Dual-mode Oscillators for Clocks and Sensors", Proc of the 1999 IEEE Ultrasonics symposium, pp. 859-868, 1999.
Anatoly Kosykh, Igor Abramson, Victor Bagaev, "Dual-mode Crystal Oscillators with Resonators Excited on B and C Mode", Proc. of the 1994 IEEE International Frequency Control Symposium, pp. 578-586, 1994.
E. P. Quévy, S. A. Bhave, H. Takeuchi, T.-J. King, and R. T. Howe, "Poly-SiGe High Frequency Resonators Based on Lithographic Definition of Nano-Gap Lateral Transducers," Solid-State Sensor, Actuator, and Microystems Workshop, Hilton Head Island, South Carolina, Jun. 6-10, 2004, pp. 360-363.

(Continued)

*Primary Examiner*—Thomas M. Dougherty
(74) *Attorney, Agent, or Firm*—Henry K. Woodward; John P. O'Banion

(57) ABSTRACT

Disclosed is an oscillator that relies on redundancy of similar resonators integrated on chip in order to fulfill the requirement of one single quartz resonator. The immediate benefit of that approach compared to quartz technology is the monolithic integration of the reference signal function, implying smaller devices as well as cost and power savings.

22 Claims, 4 Drawing Sheets

OTHER PUBLICATIONS

T. A. W. Roessig, "Integrated MEMS Tuning Fork Oscillator for Sensor Application", Ph.D. Dissertation, UC Berkeley, 1998.

V. Kajaakari, T. Mattila, A. Oja, J. Kiihamaki, H. Seppa, "Square Extensional Mode Single Crystal Silicon Micromechanical Resonator for Low-Phase Noise Oscillator Applications", IEEE Electron Device Letters, vol. 25, N°4, Apr. 2004, pp. 173-175.

M. E. Frerking, "Crystal Oscillator Design and Temperature Compensation", New York, 1978.

Y.W Lin, S. Lee, S.S. Li, Y. Xie, Z. Ren, C. T. C. Nguyen, "Series-resonant VHF Micromechanical Resonator Reference Oscillators", IEEE Journal of Solid State Circuits, vol. 38, N°12, Dec. 2004, pp. 2477-2491.

W.T. Hsu, C.T.C. Nguyen, "Stiffness-Compensated Temperature Insensitive Micromechanical Resonators", Proc. of the IEEE Int. Conf. on Microelectromechanical Systems, Las Vegas NV, 2002, pp. 731-734.

Gianluca Piazza, Albert P. Pisano, "Dry-Released Post-CMOS Compatible Contour-Mode Aluminium Nitride Micromechanical Resonators for VHF Application" 2004 Solid State Sensor, Actuator and Microsystems Workshop (Hilton Head 2004), Hilton Head Island, South Carolina, Jun. 6-10, 2004, pp. 37-40.

Emmanuel P. Quevy and Roger T. Howe, "Redundant MEMS Resonators for Precise Reference Oscillators", RFIC Conference, Long Beach, CA, Jun. 12, 2005, 4 pages.

* cited by examiner

TEMPERATURE COMPENSATED OSCILLATOR INCLUDING MEMS RESONATOR FOR FREQUENCY CONTROL

CROSS REFERENCE TO RELATED APPLICATIONS

This application claims priority under 35 U.S.C. §119 to U.S. Provisional Patent Application No. 60/660,211, filed on Mar. 9, 2005, which is incorporated by reference herein for all purposes.

STATEMENT OF GOVERNMENT RIGHTS

The U.S. government has rights in the disclosed invention pursuant to grants to The University of California including DARPA No. N66001-01-1-8967.

BACKGROUND OF THE INVENTION

The invention relates generally to frequency oscillators, and more particularly the invention relates to the use of temperature dependent resonators to establish oscillation frequency.

It has been shown that RF surface micro-machined MEMS resonators were potential replacement part for quartz resonators in reference oscillator applications. The main advantage relies in the form factor and path to on-chip integration, but this is at the expense of accuracy of the resonance frequency and higher temperature drift.

Indeed for wireless handset application, state of the art quartz resonators exhibits frequency tolerance of +/−2 ppm after hand trimming involving deposition of infinitesimal quantity of metal at the quartz surface. For the same application, it has become clear that laterally vibrating bulk resonators were the structures of choice to fulfill application requirements in term of frequency, quality factor and power handling. But, in the case of surface micro-machined MEMS resonators, one can evaluate to the first order the fabrication tolerance on the absolute resonance frequency using tolerance on the lateral dimensions. State of the art lithography tools can achieve +/−15 nm in tolerance. For GSM/CDMA, typical resonator dimensions are in the range of 30–60 µm. This translates into an absolute tolerance of higher than 200 ppm. This already high value compared to quartz is assumed without taking into account effect of the stress in the package and other non-idealities in the micromachining process (anchors, alignment between layers, anisotropy . . . ) and makes a difficult trimming of the frequency necessary.

In terms of thermal characteristic, research has shown that surface micro-machined resonators (polysilicon, silicon-germanium, or piezoelectric) exhibit a temperature drift of more than 2500 ppm over a −30° C.–85° C. range. This makes the use of compensation techniques developed for quartz crystal oscillators very difficult, where a typical AT-cut first mode resonator experiences a maximum excursion of +/−20 ppm over the full temperature range.

SUMMARY OF THE INVENTION

To address these limitations experienced with MEMS resonators, this invention relies on redundancy of similar resonators integrated on chip in order to fulfill the requirement of one single quartz resonator. The immediate benefit of that approach compared to quartz technology is the monolithic integration of the reference signal function, implying smaller devices as well as cost and power savings.

The invention includes a method for integrated temperature sensing using micro-electro-mechanical resonators based oscillators. The method relies on the ability to integrate the MEMS resonators directly on top of the oscillator CMOS circuitry. The system is based on two independent oscillators. Because MEMS resonators are small, redundancy is possible, and two resonators can be used instead of one. Unlike other approaches, it allows to design the resonant frequency and the temperature characteristic of each oscillator independently. The measured quantity is the frequency difference between the two oscillators, which is a precisely known linear function of temperature.

The invention and object and features thereof will be more readily apparent from the following detailed description and appended claims when taken with the drawings.

DETAILED DESCRIPTION OF ILLUSTRATIVE EMBODIMENTS

Figure 1:
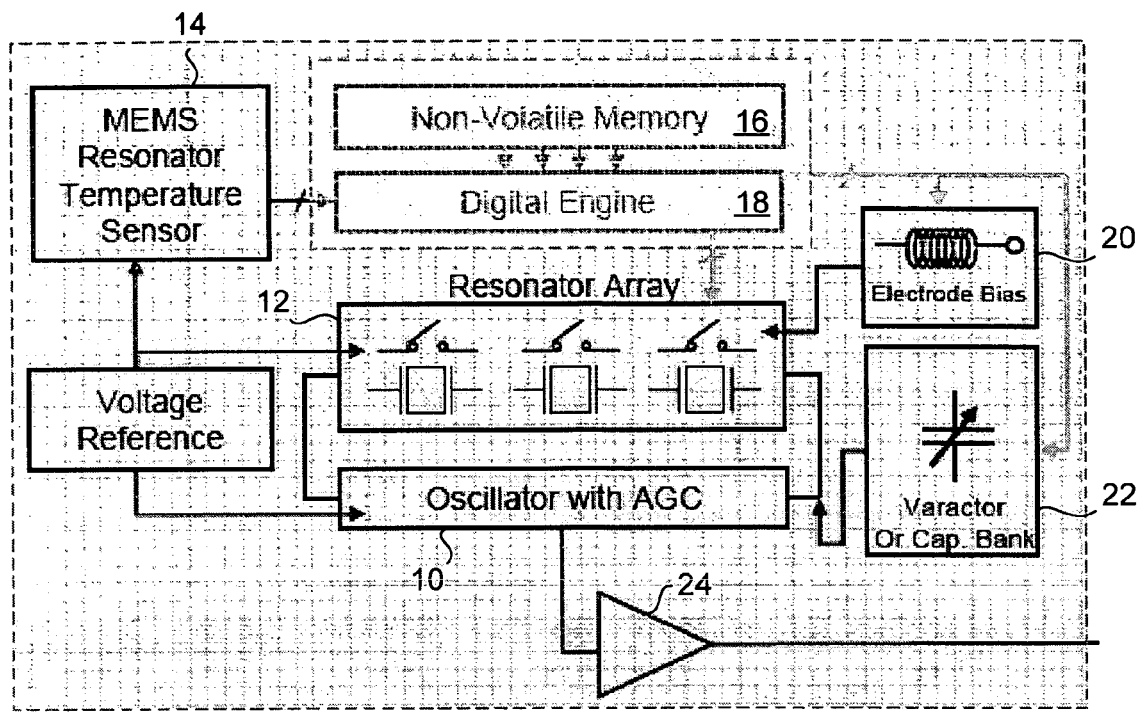
FIG. 1 illustrates architecture of an array based temperature compensated reference oscillator in accordance with an embodiment of the invention.

The invention provides temperature compensation for an oscillator by including an array of resonators with the oscillator, each resonator having a temperature dependent oscillator frequency. A switch selectively switches each resonator with the oscillator circuit depending on temperature.

Using the ability to stack resonators (Silicon Germanium for example) directly on top of CMOS chips, it is possible to link an array of similar resonators to a unique oscillator, and switch from one resonator to the other when the frequency of the resonator in use is out of range because of temperature drift. A high level architecture of a temperature compensated oscillator based on this concept is depicted on the diagram in FIG. 1. Here an oscillator with automatic gain control 10 has a frequency determined by resonator array 12. Temperature sensor 14 establishes resonator selection and a digital engine 16 and memory 18 set electrode bias at 20 and varactor capacitance 22. Oscillator output is applied through buffer amplifier 24.

Figure 2:
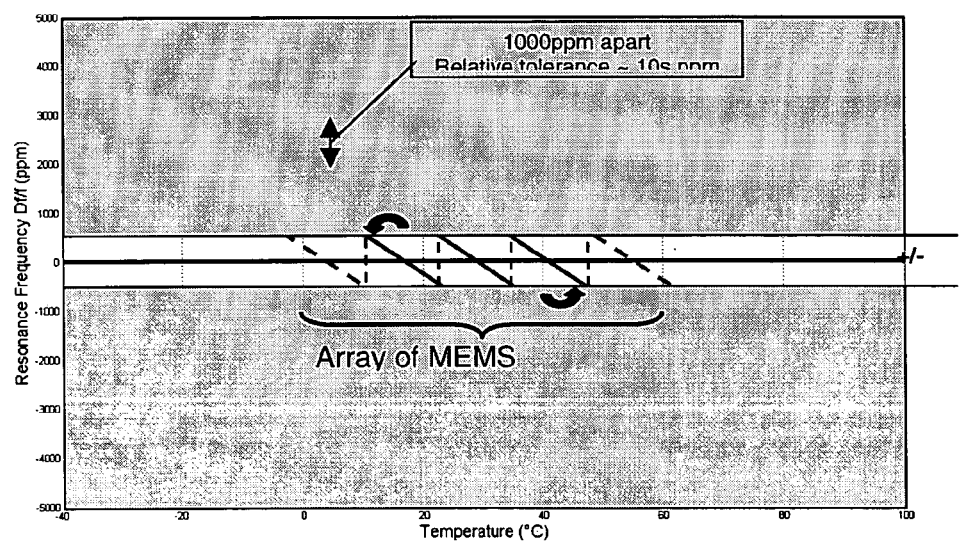
FIG. 2 is a graph illustrating temperature characteristic over the full array.

A thermal sensor provides an absolute measure of the temperature to a digital engine that decides on which resonator to switch on to the oscillator core. Indeed, each resonator is designed so that its frequency excursion stays within a given range over a limited temperature range. For a given resonator active over a given temperature range, the resonator next to it is designed with a frequency offset so that it will fall into the specified frequency range in the next temperature range (higher or lower). This is illustrated in FIG. 2 showing the juxtaposed temperature characteristic of each resonator of the array.

Figure 3:
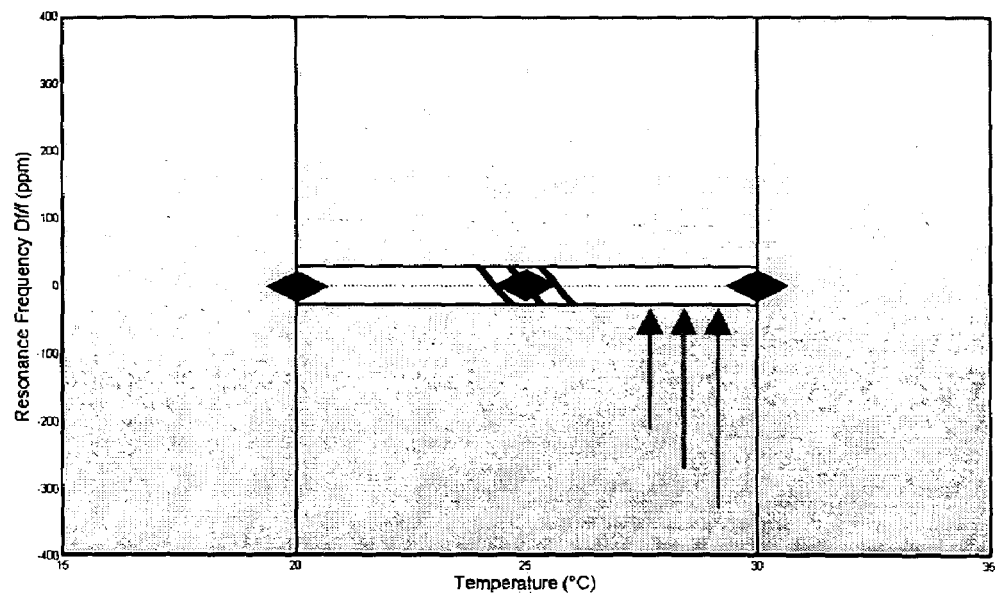
FIG. 3 is a graph illustrating temperature characteristic of one resonator over its functional temperature range.

In this example, each resonator has a +/−4000 ppm excursion over the full temperature range. The offset between them is set to 1000 ppm so that the cross over between temperature ranges occurs within +/−500 ppm of the target frequency. As shown in FIG. 3, one resonator is active only over a limited temperature range, here from 20 to 30° C. Red double arrows illustrate the absolute tolerance on the resonator frequency. Thanks to a one-time calibration, the switching temperatures are set into a non-volatile memory so that the resonator hits the target frequency at the center of the working temperature range. This makes the system insensitive to absolute fabrication tolerance of each resonator, thus avoiding the need for trimming.

Eventually, as shown in FIG. 1, a simple technique based on frequency pulling (DC electrostatic force on the resonator structure, or tunable capacitive load) is used to tune the frequency of the active resonator further down within the specification of the application, illustrated by the highlighted window in FIG. 3.

Through redundancy and on-chip calibration, the system relies on relative tolerance between each resonator, rather than absolute value. This feature provides better overall accuracy.

Figure 4:
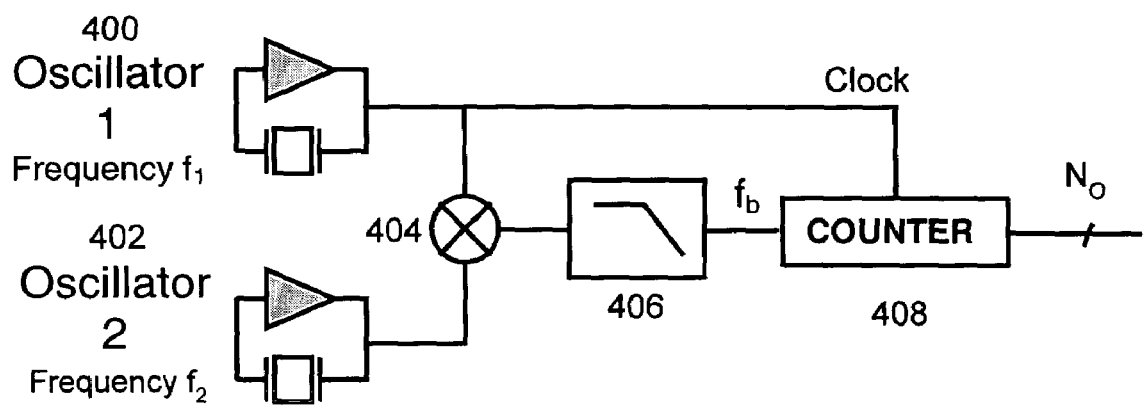
FIG. 4 illustrates a MEMS resonator based temperature sensor in accordance with an embodiment of the invention.

Consider now specific embodiments of a temperature sensor for use in the temperature compensated oscillator as shown schematically in FIG. 4. Here oscillator 400 and oscillator 402 provide frequencies $f_1$ and $f_2$ which are mixed at 404 and the mixer output is applied through filter 406 to counter 408, the output of oscillator 400 provided a clock to counter 408.

Compared to other methods enabling monolithic integration of the temperature sensor, the monitored quantity is a signal frequency, which is measured by far higher accuracy than any other. A resembling method used with quartz resonators relies on the use of higher harmonic with the same resonator to measure the difference in frequency drift as a function of temperature. Called "Dual mode oscillators", the frequency difference is set by the geometry of the quartz, and the mode order picked for measurement. Intrinsically, this makes the frequency ratio between the two modes at least 3.

By the use of MEMS resonators, the two measured modes can be set independently both in terms of resonance frequency and temperature drift. Unlike dual-mode quartz based oscillators, both modes can be set at the exact same frequency which saves the use of a multiplier in the first oscillator path to the mixer.

Equation 1 shows the temperature characteristic of one MEMS resonator based oscillator, referenced at (f0, T0) so that $\Delta T = T - T0$.

$$\frac{\Delta f}{f} = \alpha_{1,i} \cdot \Delta T + \alpha_{2,i} \cdot \Delta T^2 + \alpha_{3,i} \cdot \Delta T^3 \qquad (1)$$

The measured frequency, called "beat frequency", is given by $$f_b = f_1 - f_2 \qquad (2).$$

Its temperature characteristic can be derived as follows in terms of each resonator temperature characteristic:

$$\frac{\Delta f_b}{f_b} = \frac{1}{1-N} \cdot \frac{\Delta f_1}{f_1} - \frac{N}{1-N} \cdot \frac{\Delta f_2}{f_2} \qquad (3)$$

with $$N = \frac{f_2}{f_1}$$

And thus, as a function of temperature, the frequency drift is:

$$\frac{\Delta f_b}{f_b}(T) = \qquad (4)$$

$$\frac{\alpha_{1,1} - N \cdot \alpha_{1,2}}{1-N} \cdot \Delta T + \frac{\alpha_{2,1} - N \cdot \alpha_{2,2}}{1-N} \cdot \Delta T^2 + \frac{\alpha_{3,1} - N \cdot \alpha_{3,2}}{1-N} \cdot \Delta T^3$$

The beat frequency is then measured by a counter. This can be a frequency or period meter that provides a near linear function of temperature.

As stated before, because the two structures are independent, resonance frequencies are independent, unlike quartz resonators where the frequencies are related to each other by the order of their mode. By designing each structures so that they have their resonance frequency as close as possible while their linear temperature coefficient is set to be different, one can maximize the beat frequency linear coefficient for high temperature sensitivity. At the same time, higher order coefficients $\alpha 2,i$ and $\alpha 3,i$ of each resonator are close enough to have the beat frequency non-linear coefficients close to zero. The tolerance on the measurement, i.e. the beat frequency fb is thus given by the relative tolerance between the frequency of the resonators which can be made small through careful layout matching made possible by the fact that both resonators are integrated on-chip and close to each other. This results in better accuracy.

Design of MEMS resonators with tailored frequency-temperature characteristics: More specifically, while the frequency is set by the dimension of the structures, one can take advantage of the thermal expansion coefficient mismatch between the structural layer and the silicon substrate to set the overall temperature coefficient of each oscillator. This concept is illustrated and applied in FIG. 5a in the case of a Double Ended Tuning Fork (DETF) resonator.

Figure 6:
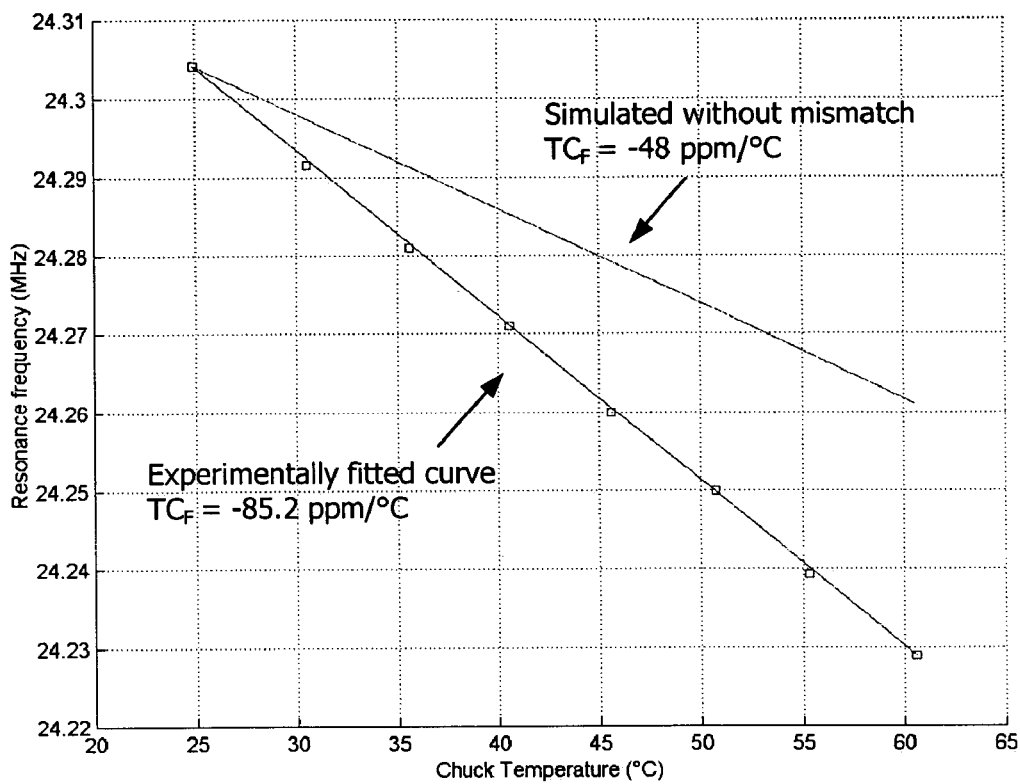
FIG. 6 is a graph of resonance frequency versus temperature which illustrates temperature characteristics of a 24 MHz DEFT.

FIG. 6 shows the experimental temperature characteristic of a 24 MHz DETF on the blue curve, while the red curve is the extracted characteristic of the same resonator when the effect of thermal expansion mismatch has been removed, and normalized at 25° C. Those curves exhibit a slope of −85 ppm/° C. and −48 ppm/° C. respectively.

Indeed, it can be shown that the resonance frequency of the first mode of DETF follows to the first order the equation hereafter:

$$f_{!1st\ mod\ e} = \frac{1}{2\pi} \cdot \sqrt{\frac{199 \cdot \frac{I_M(T) \cdot E(T)}{L(T)^3} + 4.89 \cdot \frac{F(T)}{L(T)}}{0.389 \cdot \rho_{SiGe} \cdot W \cdot L \cdot h}} \qquad (5)$$

with

-continued $$I_M(T) = \frac{W(T)^3 \cdot h(T)}{12}$$

the moment of inertia.

Figure 5A:
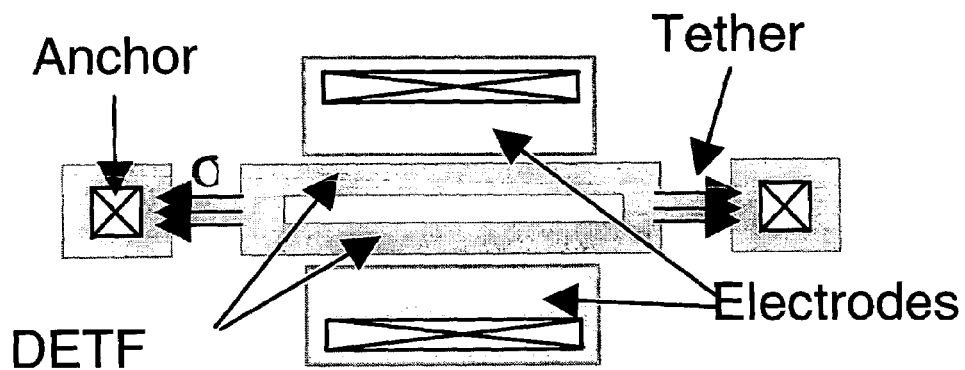
FIGS. 5($a$), 5($b$) and 5($c$) are schematics of double ended tuning fork (DEFT) resonators with different temperature sensitivity.

The denominator under the square root represents the effective mass of the resonating system. The first term on the numerator is the stress-free effective spring constant on the structure, dependant on temperature T through expansion on the dimensions (length L, Width W, and Thickness h) and temperature coefficient of the Young's Modulus E. The second term represents the effect of any axial force applied to the tines of the resonator. In the case of FIG. 5a, the mismatch between structural material (e.g. SiGe) and the substrate (e.g. Si) creates an axial force on the tines that can be expressed as follows:

$$F(T) = \sigma(T) \cdot W(T) \cdot h(T) = \frac{\alpha_{TSi} - \alpha_{TSiGe}}{1 + \alpha_{TSiGe} \cdot dT} \cdot E(T) \cdot dT \quad (6)$$

where αT is the thermal expansion coefficient for each material, and dT represents the excursion from the nominal temperature.

Figure 5B:
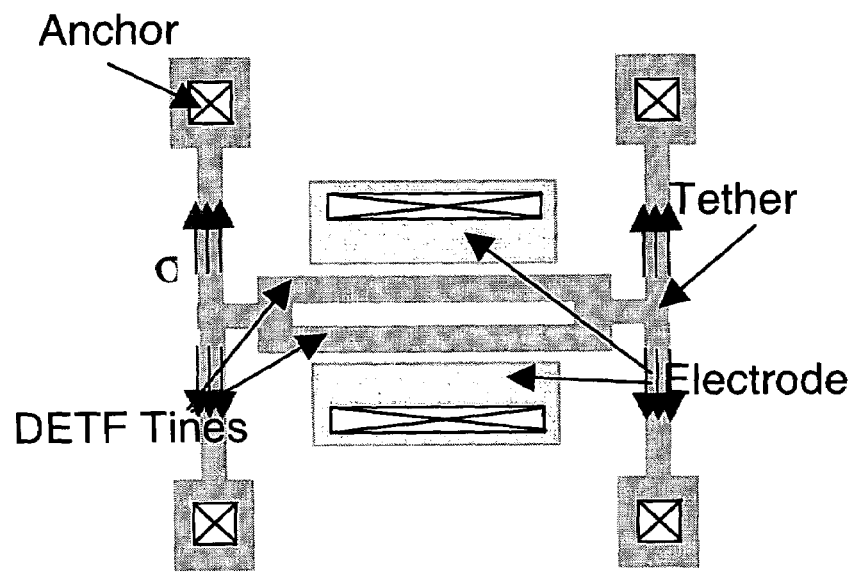

Unlike the first term in equation (5), this component only depends on the configuration of the anchor. Indeed as depicted in FIG. 5b, the anchor can be design so that the tuning fork remains insensitive to thermal expansion mismatch. Here the thermal expansion mismatch is expressed along a direction orthogonal to the resonator tines while the stress-free effective spring constant remains unchanged. In that case, s(T) in equation (6) becomes zero.

Figure 5C:
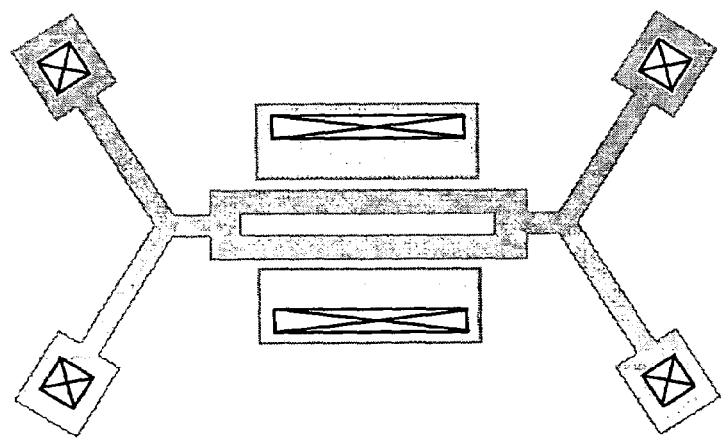

FIG. 5c provides an additional example where the orientation of the anchor allows tailoring the influence of such a mismatch. This concept shown in the specific example of the DETF structure can be applied to any mechanical structure that exhibits resonance frequency sensitivity to temperature as a function of the anchor configuration (Disks, Squares . . . ). It is also worthy to note that, although the concept can be applied to other materials like metals, where there is also an expansion coefficient mismatch with the silicon substrate, SiGe as the structural material for the resonator allows for a much better loss factor, and thus much better stability of the measured frequency. This feature results in better accuracy of the measurement.

Temperature compensation for reference oscillators: While having the slope as high as possible is desirable in the case of the temperature sensor, it is also possible to make it as low as possible to compensate for the temperature drift of the resonator. The beat frequency fb becomes the reference signal. Note that in the diagram of FIG. 1, the counter is not longer used for that application.

For example, if the target reference frequency is a 13 MHz signal, one can design the two resonators so that:

At $T=T0, f_b=f_1-f_2=13$ MHz

Figure 7:
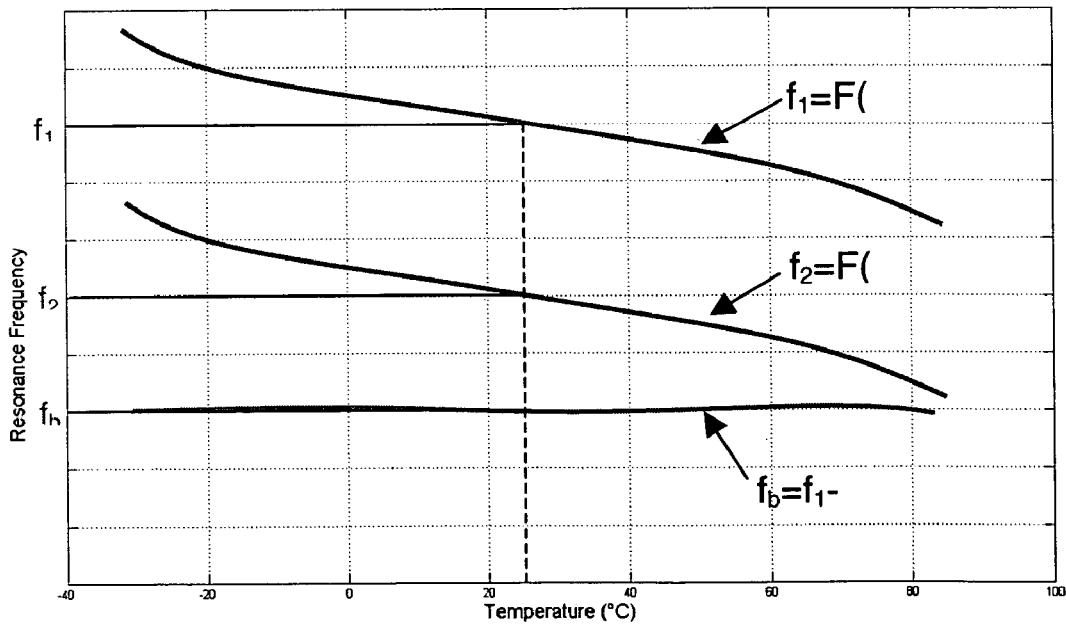
FIG. 7 is a graph illustrating temperature characteristics in a dual resonator based frequency reference system.

At the same time, in equation (4), it is possible with proper design to have:

$\forall i \; \alpha_{1,i} f_{10} = \alpha_{2,i} f_{20}$ at least with the first order coefficient. This results in the characteristic depicted in FIG. 7, where the beat frequency is a near constant function of temperature.

In summary, on-chip temperature measurement provides an accurate true value compared to external sensing. The frequency difference between the two fully integrated oscillators is a measure of the temperature at the exact location where the resonator is vibrating. It eliminates any temperature gradient between the resonator and the temperature sensor. Absence of thermal lag (thermal path difference, difference in thermal time constant) avoid hysteric behavior. In the case of temperature compensation, integration of redundant MEMS structures with similar behavior enables mutual compensation of non-idealities like temperature drift.

Advantages of the oscillator and sensor in accordance with the invention include:

Single chip refrence oscillator
No hand-trimming of the frequency is necessary
On-chip temperature compensation
High sensitivity
No thermal lag/No hysteretic behavior thanks to mutual self temperature sensing
Ability to compensate for first order temperature coefficient of both resonator
The tolerance on the measurement is set by the relative tolerance between the frequencies of each resonator which can be low compared to the absolute tolerance of each resonator.
Low power consumption thanks to on-chip integration.

While the invention has been described with reference to specific embodiments, the description is illustrative of the invention and is not to be construed as limiting the invention. Various modification and applications may occur to those skilled in the art without departing from the spirit and scope of the invention as defined by the appended claims.

What is claimed is:

1. A temperature compensated oscillator comprising:
    a) an oscillator circuit,
    b) an array of resonators with each resonator connectable with the oscillator circuit to establish oscillation frequency, each resonator having a temperature dependent oscillation frequency with the oscillation frequencies occurring in a fixed frequency range and over a range of temperature, and
    c) a switch for selectively switching each resonator with the oscillator circuit depending on temperature.

2. The oscillator as defined by claim 1 and further including:
    d) a temperature sensor for sensing temperature and controlling the switch in selectively switching resonators with the oscillator circuit.

3. The oscillator as defined by claim 2 wherein the oscillator circuit comprises part of a semiconductor integrated circuit and the array of resonators are formed on the integrated circuit.

4. The oscillator as defined by claim 3 wherein each resonator is a micromechanical MEMS resonator.

5. The oscillator as defined by claim 4 wherein the integrated circuit comprises a silicon substrate and the micromechanical MEMS resonator comprises silicon germanium.

6. The oscillator as defined by claim 4 wherein each resonator comprises a double ended tuning fork (DEFT) resonator.

7. The oscillator as defined by claim 4 and further including:
    e) means for tuning each resonator to maintain a resonance frequency range in a specific temperature range.

8. The oscillator as defined by claim 7 wherein the means for tuning comprises electrostatic force.

9. The oscillator as defined by claim 7 wherein the means for tuning comprises a tunable capacitive load.

10. The oscillator as defined by claim 2 wherein the temperature sensor comprises first and second sensor oscillators each including an integrated circuit in a semiconductor substrate and a sensor resonator in parallel with a sensor oscillator and establishing oscillation frequency of the sensor oscillator, the sensor resonators having different temperature sensitivities whereby the difference in frequency between the sensor oscillators is temperature dependent, and apparatus responsive to the outputs of the sensor oscillators for determining a frequency difference in the outputs as a measure of temperature.

11. The oscillator as defined by claim 10 wherein the sensor oscillators have a common resonance frequency at one temperature.

12. The oscillator as defined by claim 10 wherein each sensor resonator is a micromechanical MEMS resonator.

13. The oscillator as defined by claim 12 wherein the integrated circuit comprises a silicon substrate and the micromechanical MEMS resonator comprises silicon germanium.

14. A temperature sensor comprising first and second sensor oscillators each including an integrated circuit in a semiconductor substrate and a sensor resonator in parallel with a sensor oscillator and establishing oscillation frequency of the sensor oscillator, the sensor resonators having different temperature sensitivities whereby the difference in frequency between the sensor oscillators is temperature dependent, and apparatus responsive to the outputs of the sensor oscillators for determining a frequency difference in the outputs as a measure of temperature.

15. The temperature sensor as defined by claim 14 wherein the sensor oscillators have a common resonance frequency at one temperature.

16. The temperature sensor as defined by claim 15 wherein each resonator comprises a micromechanical MEMS resonator.

17. The temperature sensor as defined by claim 16 wherein each resonator comprises a double ended tuning fork (DEFT) resonator.

18. The temperature sensor as defined by claim 15 wherein the integrated circuit comprises a silicon substrate and the micromechanical MEMS resonator comprises silicon germanium.

19. The temperature sensor as defined by claim 18 wherein mismatch of thermal expansion coefficient of the substrate and thermal expansion coefficient of the resonators is used to set an overall temperature coefficient of each sense oscillator.

20. The temperature sensor as defined by claim 19 wherein each resonator has anchors to the substrate, and resonator temperature sensitivity depends on anchor configuration.

21. The temperature sensor as defined by claim 14 wherein mismatch of thermal expansion coefficient of the substrate and thermal expansion coefficient of the resonators is used to set an overall temperature coefficient of each sense oscillator.

22. The temperature sensor as defined by claim 20 wherein each resonator has anchors to the substrate, and resonator temperature sensitivity depends on anchor configuration.

* * * * *